United States Patent

Mishima et al.

[11] Patent Number: 6,018,488
[45] Date of Patent: Jan. 25, 2000

[54] SEMICONDUCTOR MEMORY DEVICE AND METHOD RELIEVING DEFECT OF SEMICONDUCTOR MEMORY DEVICE

[75] Inventors: Akihiro Mishima; Yoichi Suzuki; Yasumitsu Nozawa; Masami Masuda, all of Yokohama, Japan

[73] Assignee: Kabushiki Kaisha Toshiba, Kanagawa-Ken, Japan

[21] Appl. No.: 09/104,626

[22] Filed: Jun. 25, 1998

[30] Foreign Application Priority Data

Jun. 26, 1997 [JP] Japan ..................................... 9-170548
Aug. 27, 1997 [JP] Japan ..................................... 9-230985

[51] Int. Cl.[7] ...................................................... G11C 7/00
[52] U.S. Cl. ......................... 365/225.7; 365/200; 365/203
[58] Field of Search ................................. 365/225.7, 200, 365/203

[56] References Cited

U.S. PATENT DOCUMENTS

| | | | |
|---|---|---|---|
| 5,206,831 | 4/1993 | Wakamatsu | 365/200 |
| 5,276,360 | 1/1994 | Fujima | 365/200 |
| 5,355,340 | 10/1994 | Coker et al. | 365/200 |
| 5,689,465 | 11/1997 | Sukegawa et al. | 365/225.7 |
| 5,933,382 | 8/1999 | Yi et al. | 365/225.7 |

FOREIGN PATENT DOCUMENTS 5314790  11/1993  Japan .
8138399  5/1996  Japan .

*Primary Examiner*—Trong Phan
*Attorney, Agent, or Firm*—Loeb & Loeb, LLP

[57] ABSTRACT

A semiconductor memory device includes bit lines and word lines arranged lengthwise and breadthwise, memory cells 1 capable of reading out and writing in, MOS transistors Q1 and Q2 for pre-charge, MOS transistors Q3 for short-circuiting, and transistors Q4 and Q5 for setting voltage level. The bit lines are provided two pieces at each bit. Between the MOS transistors Q1, Q2 for pre-charge and the bit lines driving power supply terminal Vcc, three pieces of the fuses F1–F3 are connected at each column. When the leak defect occurs to the bit lines, all of the fuses F1–F3 connected to the bit lines are cut. Further, a semiconductor memory device includes a plurality of section regions, a redundancy circuit RD1 which replaces a defective cell at each section region, a redundancy circuit RD2 which replaces the defective cell at each row address. The section regions are provided at each address in the column direction. In each section region, cell ground power supply lines Vss are formed circularly. Outside each section region a pad ground power supply line Vss' are formed. Each of the cell ground power supply lines Vss and the pad ground power supply line Vss' are connected via a plurality of fuses F connected in parallel.

15 Claims, 13 Drawing Sheets

SEMICONDUCTOR MEMORY DEVICE AND METHOD RELIEVING DEFECT OF SEMICONDUCTOR MEMORY DEVICE

BACKGROUND OF THE INVENTION

1. Field of the Invention

The present invention relates to circuit configuration of a static RAM (SRAM). More specifically, the invention relates to a technique suppressing occurrence of leak current in the SRAM.

2. Related Background Art

A static RAM, which will be called a SRAM hereafter, is generally utilized to a cache memory inside a CPU and so on, because the SRAM is not in need of performing refreshing and is enable to access for memory cell with high speed.

FIG. 13 is a circuit showing an internal configuration of a conventional MOS type of the SPAM. The circuit shows the configuration per one column. The SRAM in FIG. 13 includes bit lines BL, /BL and word lines W, which are arranged lengthwise and breadthwise, memory cells 1 capable of reading out and writing in, MOS transistors Q1 and Q2 provided for pre-charge, MOS transistors Q3 provided for short-circuiting, and MOS transistors Q4 and Q5 provided for setting voltage level of a pair of bit lines BL and /BL.

The transistors Q1 and Q2 controls so that the pair of the bit lines become high level just before reading out of the memory cell 1 and writing in the memory cell 1. The transistor Q3 controls so that the pair of bit lines becomes the same voltage.

Inside the SRAM in FIG. 13, two pieces of the bit lines is provided at each bit. These bit lines are set to contrary logic to each other, in case of reading out of the memory cell 1 and writing in the memory cell 1.

In case of forming the SRAM shown in FIG. 13 on the semiconductor substrate, it is general to form the bit lines BL and /BL by using AL layer with lower impedance. However, due to the progress of minute process technique, memory capacity of the SRAM is tend to increase by degrees, while the width of wires and the space between the wires become short. Accordingly, the defect due to the leak current and so on is prone to occur.

More especially, in case of being integrated highly, because it becomes inevitable to arrange the bit lines BL and /BL, the word lines W and so on adjacently to each other, as shown in FIG. 13, cases which cannot but arrange the ground lines Vss beside the bit lines BL and /BL increase.

However, when the bit lines BL and /BL and the ground lines Vss are arranged adjacently, all of the lines BL, /BL and Vss are prone to short-circuit to each other. If short-circuited, the leak current flows from the bit lines driving power supply terminal Vcc to the ground line Vss via the bit lines BL and /BL.

As shown in FIG. 14, the bit lines BL and the drain terminal 11 of transfer gates in the memory cell 1 are connected to each other via the contact hole 12. Accordingly, when the width of the bit lines is thin, if the hole position of the contact hole 12 deviates barely, the bit lines BL contacts with the ground line Vss, and the leak current flows from the power supply terminal Vcc to the ground line Vss via the contact hole 12; consequently, it becomes impossible to fill the spec of a current at a static operating period. Such a state is called "standby defect" hereafter.

Among the conventional SRAM, there are ones including a redundancy circuit which replaces the defective memory cell unable to correctly read out and write in, the defect being called a function defect hereafter, by the other memory cell. However, even if the defective memory cell is replaced by the redundancy circuit, it is impossible to reduce the leak current. Accordingly, with only the replacement of the memory cell occurring the leak, though it is possible to relieve the function defect, it is impossible to relieve the standby defect.

As a way to suppress the leak current of the bit lines, a SRAM which cuts a route that the leak current has occurred has been proposed. FIG. 15 is a diagram showing internal configuration of such a kind of SRAM, which is disclosed to Japanese publication of publication number H5-314790. The SRAM in FIG. 15 has a feature in which a PMOS transistor 22 and a fuse 23 are provided between a memory cell 21 and a power supply terminal. A memory cell is composed of a circuit similar to one shown in FIG. 16A or FIG. 16B.

The circuit in FIG. 15 includes a fuse 23 connected between the power supply terminal Vcc and the drain terminal of MOS transistors 24 and 25 in the memory cell 21. However, even if the fuse is cut, the leak current flowing through the bit lines is not suppressed.

FIG. 16A shows an example that a memory cell is composed of four MOS transistors, and FIG. 16B shows an example that a memory cell is composed of two MOS transistors and two resistors with high resistance. The circuit in FIG. 16B is enable to reduce the cell area.

On the other hand, Japanese publication of publication number H8-138399 discloses a circuit cutting the power supply line by means of the MOS transistor when the leak defect has occurred. In this publication, as shown in FIG. 17, an example providing fuses in a power supply control circuit which controls a gate voltage is being disclosed. However, in the circuit in FIG. 17, even if the fuse is cut, the power supply line is not cut. Accordingly, the circuit is complicated, and element forming area and power consumption are prone to increase.

Instead of the MOS transistor showing in FIG. 17, it is also possible to provide the fuse with simpler configuration than the MOS transistor. It is general to form the fuse out of polysilicon, the resistance being higher than the bit lines formed out of aluminum or the like. Accordingly, in case of connecting the fuse between the power supply terminal Vcc and the bit lines, the voltage drop occurs at both ends of the fuse, and the voltage supplied to the bit lines declines. In order to supplement this voltage drop, it is conceivable to heighten the voltage applied to the power supply terminal Vcc. However, in this case, it becomes impossible to drive with a low voltage; consequently, the power consumption increases.

FIG. 18 is a layout diagram of the conventional semiconductor memory device including a redundancy circuit. The semiconductor memory device in FIG. 18 is divided into four blocks B1–B4. A redundancy circuit RD1 in the column direction and a redundancy circuit RD2 in the row direction are provided inside each of the blocks B1–B4. In the column direction, a plurality of section regions SEC0–SEC7 are provided at each column address. The replacement by the redundancy circuit RD1 is performed at each of the section regions SEC0–SEC7.

FIG. 19 is an enlarged diagram showing one block in FIG. 18. A part enclosed with a dotted line in FIG. 19 corresponds to each of the section regions SEC0–SEC7. Between two section regions adjacent to each other, a word line drive circuit WSL is provided. A cell ground power supply line Vss is provided inside each of the section regions SEC0–SEC7. These cell ground power supply line Vss is connected to a pad grounded power supply line Vss' formed outside each of the section regions SEC0–SEC7.

Sense amplifiers S/A0–S/A7 amplifying a signal read out from the memory cell 1 are connected to one ends of the section regions SEC0–SEC7, respectively. These sense amplifiers S/A0–S/A7 are formed at symmetric location for an axis shown by a dot-and-dashed line in FIG. 18 and FIG. 19.

According to the recent progress; of minute process technique, because the width of the wires and the space between the wires also become short, the defect which the signal lines of the bit lines and so on, and the ground line Vss short-circuit, that is, "standby defect", is prone to occur. When such a kind of standby defection occurs, the penetrating current flows from the power supply line Vcc to the ground line Vss; consequently, the power consumption of the semiconductor memory device increases.

Though the redundancy circuits RD1 and RD2 showing in FIG. 18 and FIG. 19 can relieve the function defect, it is impossible to relieve the standby defect. Even if the memory cell that the standby defect has occurred is replaced by the redundancy circuits RD1 or RD2, the leak current flows; consequently, it is impossible to improve production yield.

SUMMARY OF THE INVENTION

The purpose of the present invention is to provide a semiconductor memory device capable of reducing the leak defect of bit lines with a simple circuit configuration without lowering the voltage of the bit lines.

Further, the purpose of the present invention is to provide a semiconductor memory device capable of relieving surely the standby defect in which the leak current flows through the ground line.

To achieve the above-mentioned object, a semiconductor memory device including bit lines and word lines, a plurality of memory cells capable of memorizing data in accordance with logic of the bit lines and sending the memorized data to the bit lines, and transistors for pre-charge for being connected to each of the bit lines in series and supplying a charging current to each of the bit lines, comprising:

a bit lines driving power supply terminal for supplying a voltage to each of the bit lines via said transistors for pre-charge;

a plurality of fuses connected in parallel between the bit lines driving power supply terminal and said transistors for pre-charge.

Further, to achieve the above-mentioned object, a semiconductor memory device for comprising a plurality of bit lines and word lines, a plurality of memory cells capable of memorizing data in accordance with the bit lines and sending the memorized data to the bit lines, and transistors for pre-charge which adjust the voltage level of each of the bit lines, comprising:

a bit lines driving power supply terminal for supplying a voltage to each of the bit lines via said a plurality of transistors for pre-charge;

a single or a plurality of units, each of which is composed of a single or a plurality of said transistors for pre-charge, between said transistors for pre-charge constituting each unit and said bit lines driving power supply terminal, a plurality of fuses being connected in parallel, at each unit.

Further, to achieve the above-mentioned object, a semiconductor memory device including a redundancy circuit capable of replacing a defective memory cell, comprising:

a cell ground power supply line for being formed in each of section region which are an address units in a column direction and being connected to ground terminals of all memory cells in said section regions;

a pad ground power supply line formed outside each of said section regions;

a plurality of fuses connected in parallel to each other between the corresponding cell ground power supply line and said pad ground power supply line.

Because the present invention connects a plurality of fuses in parallel between the transistors for pre-charge which controls the voltage amplitude of the bit lines and the bit lines driving power supply terminal, and cuts all of the corresponding fuse in case the leaking current has flown through the bit lines, it is possible to suppress the occurrence of the leaking current, and to lessen the voltage drop at both ends of the fuses less than that of the conventional circuit.

Especially, when such a fuses are provided at each column; for instance, per 8 bits, even if the number of bits and the memory capacity increases, it is unnecessary to increase the number of the fuses so much; accordingly, it is possible to lessen the forming area of the SRAM.

In case of including both of the function defect and the standby defect, because the present invention replaces the memory cell the function defect has occurred and cuts forcedly the fuse corresponding to the defect memory cell, it is possible to relieve simultaneously both of the function defect and the leak defect.

Further, according to the present invention, because a plurality of fuse are connected in parallel between the cell ground power supply line formed inside each of the section regions and the pad ground power supply line formed outside each of the section regions, in case of cutting these fuses, the leak current does not flow through the ground line; consequently, it becomes possible to surely relieve the standby defect.

DESCRIPTION OF THE PREFERRED EMBODIMENTS

Referring now to the accompanying drawings, preferred embodiments of the semiconductor memory device according to the present invention will be described in detail below. The following embodiments have a feature in which the leak current does not flow through the bit lines in the SRAM.
(First Embodiment)

Figure 1:
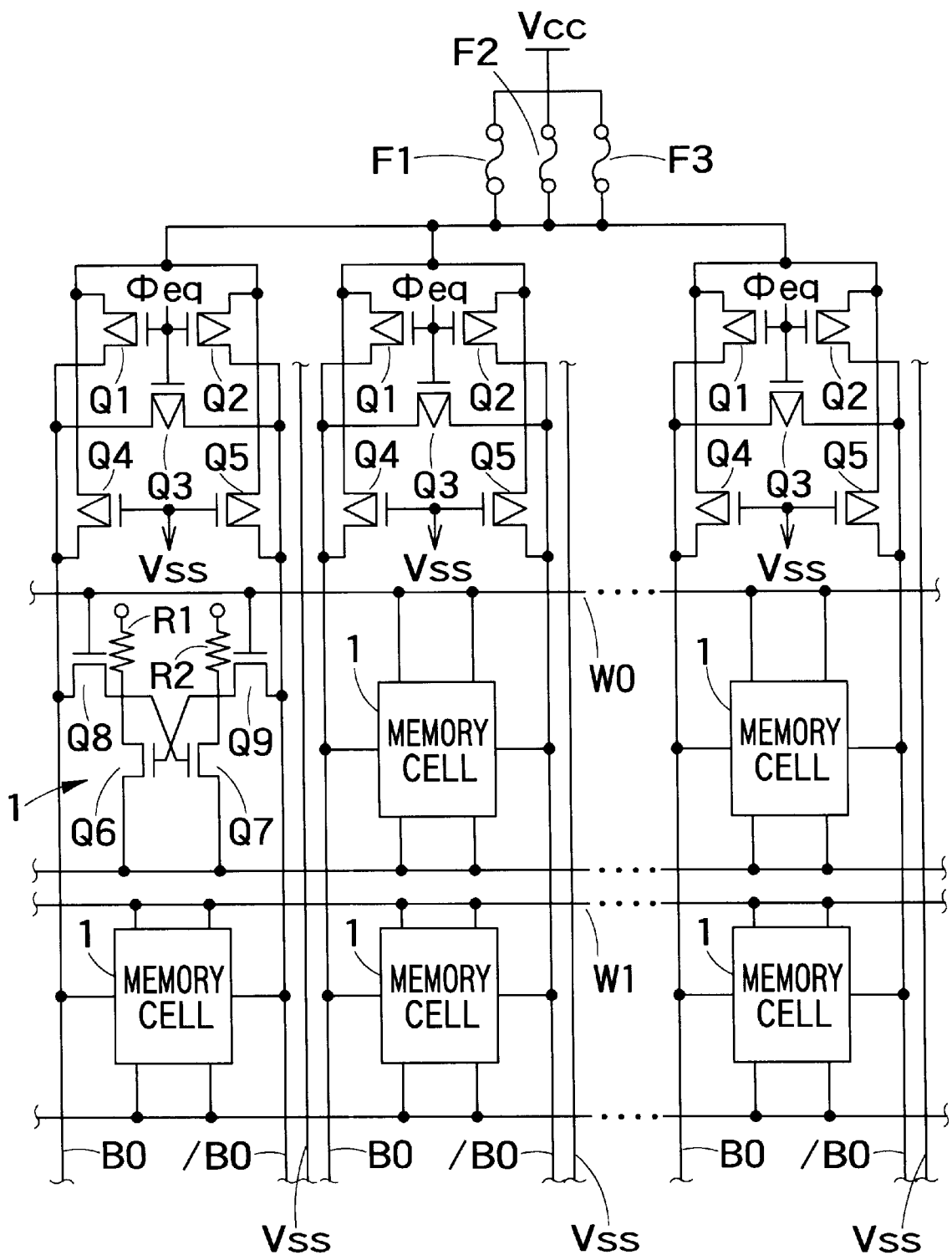
FIG. 1 is a diagram showing internal configuration of a part of the SRAM according to the first embodiment.
Figure 2:
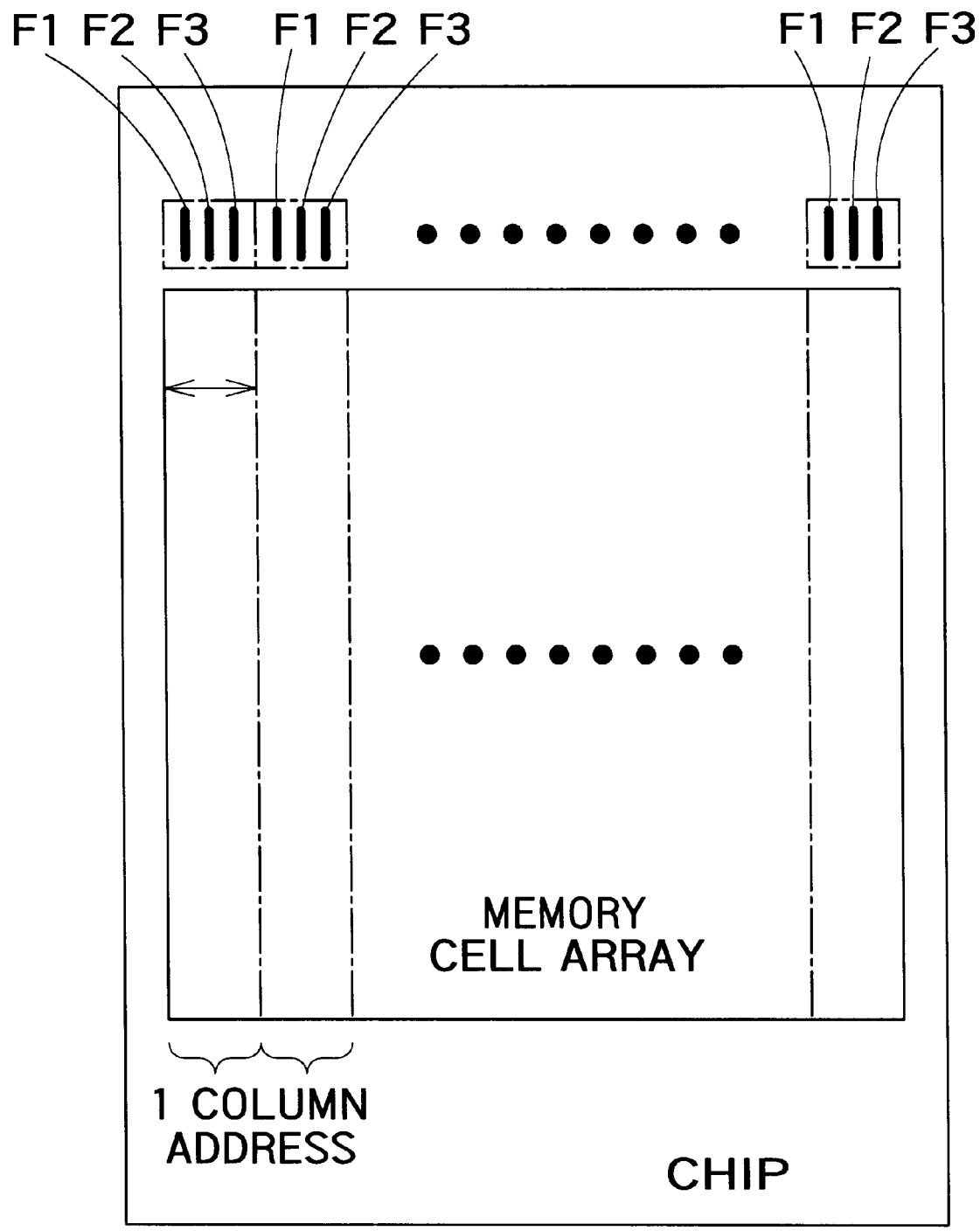
FIG. 2 is a schematic layout diagram of the SRAM in FIG. 1.
Figure 13:
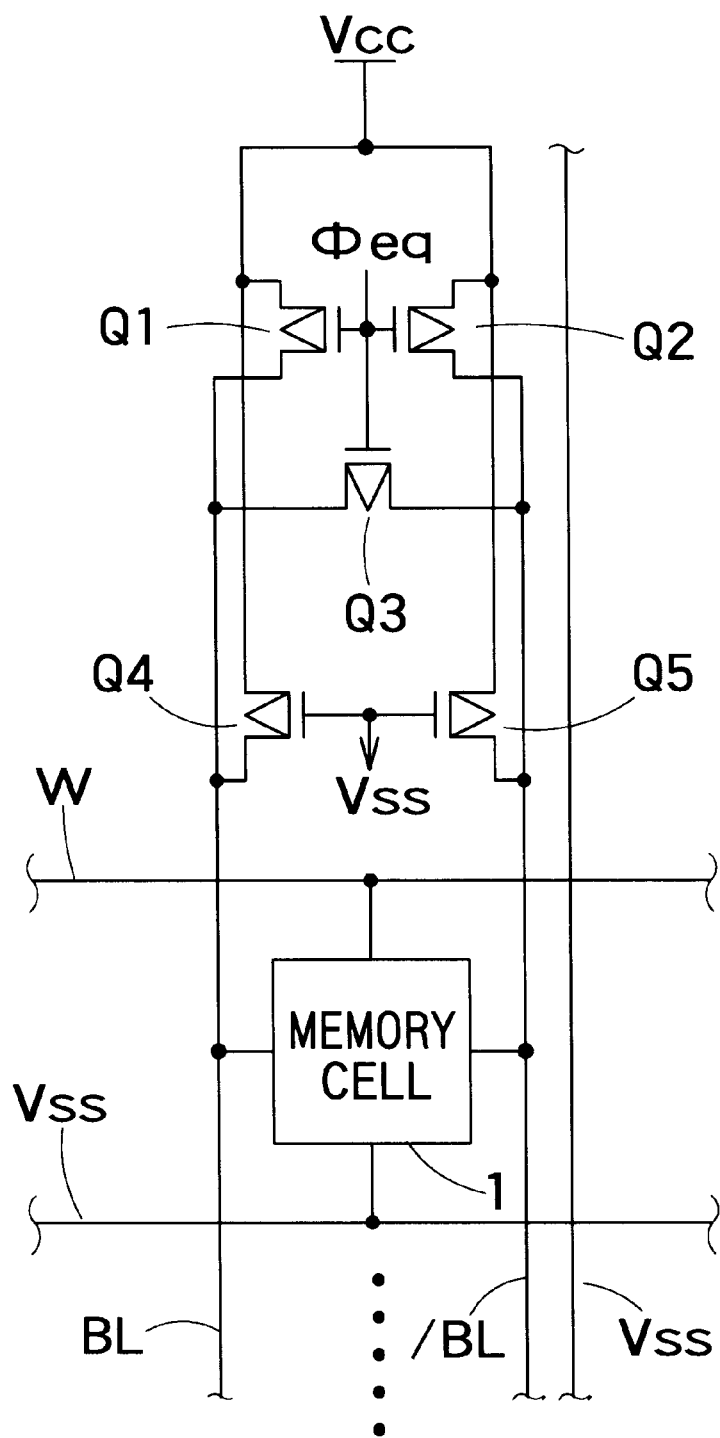
FIG. 13 is a circuit showing an internal configuration of a conventional MOS type of SRAM.
Figure 14:
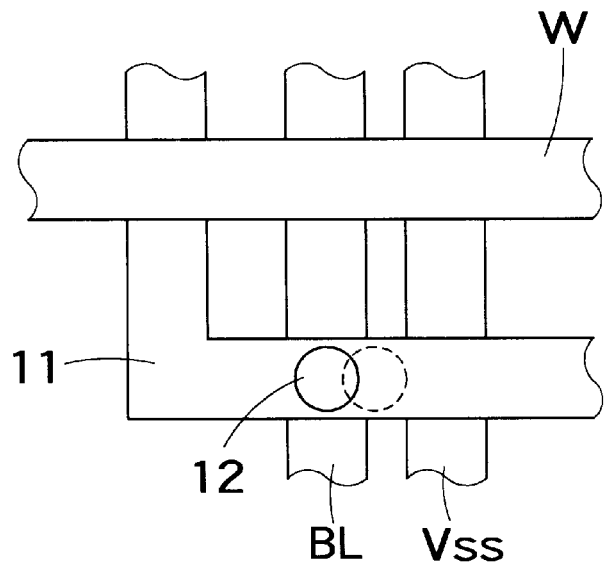
FIG. 14 is a diagram showing the defect of the contact hole.
Figure 15:
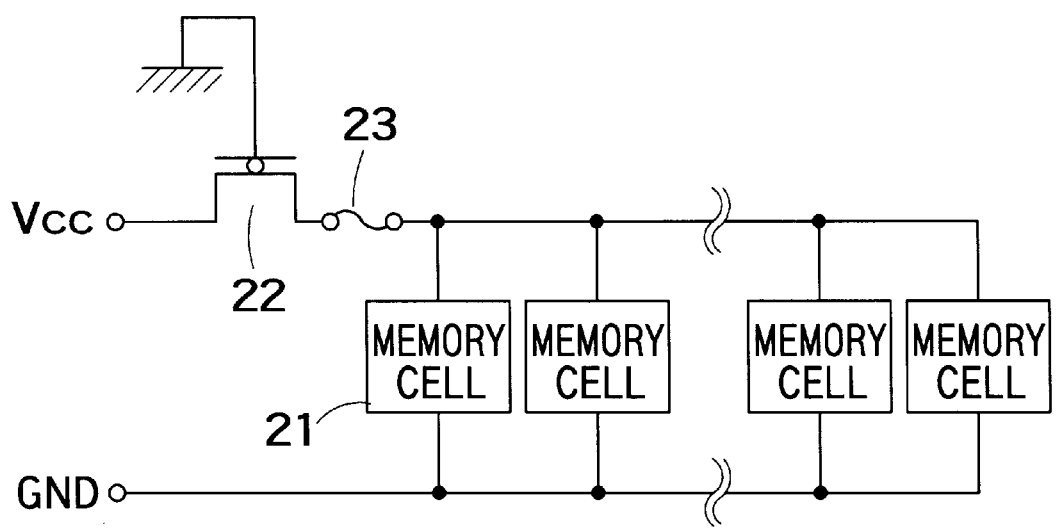
FIG. 15 is a block diagram of SRAM disclosed to Japanese publication of publication number H5-314790.
Figures 16A, 16B:
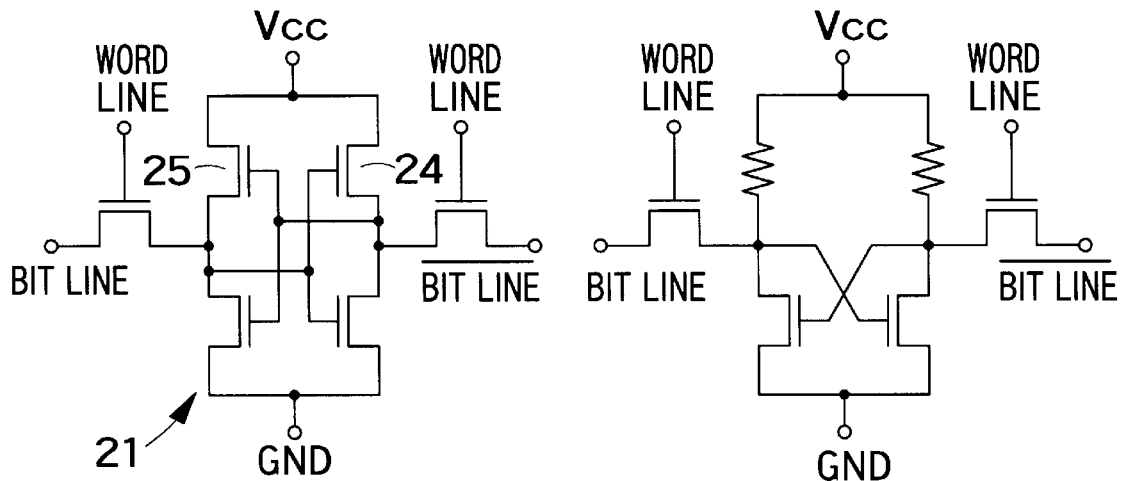
FIG. 16 is a circuit showing a detail configuration of the memory cell in FIG. 15.
Figure 17:
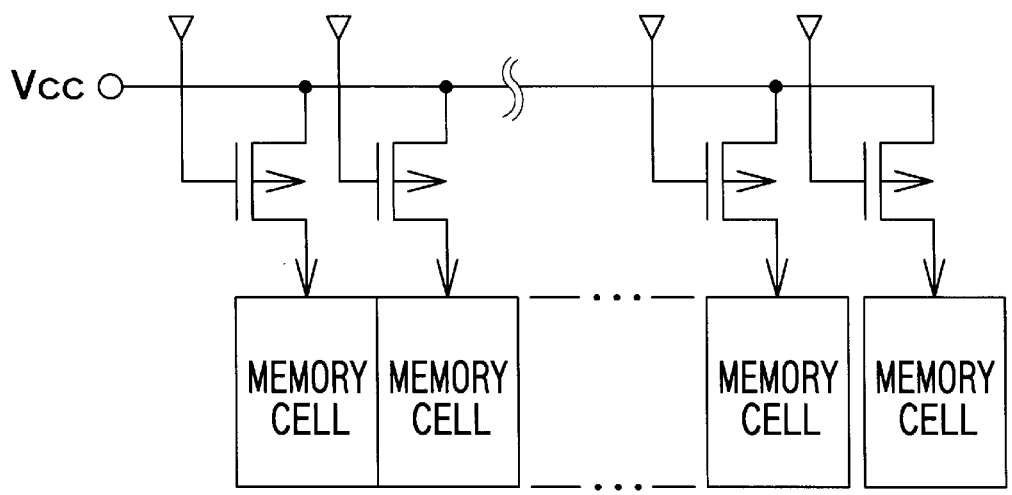
FIG. 17 is a block diagram of SRAM disclosed to Japanese publication of publication number H8-138399.

FIG. 1 is a diagram showing internal configuration of a part of the SRAM. FIG. 2 is a schematic layout diagram of the SRAM. In FIG. 1, the same symbols is being attached to the common elements as FIG. 13.

In FIG. 2, each region partitioned by a dot-and-dashed line corresponds to an address region per a column which is, for example, 8 bits. In accordance with each column address, a plurality of fuses; for example, three pieces of fuses, are provided.

FIG. 1 shows a detail configuration per a column in FIG. 2. As shown in FIG. 1, the SRAM of the present embodiment includes bit lines B0–Bn and /B0–/Bn, and word lines W0–Wn arranged lengthwise and breadthwise, memory cells 1 capable of reading out and writing in, MOS transistors Q1 and Q2 for pre-charge, a MOS transistor Q3 for short-circuiting, MOS transistor Q4 and Q5 for setting voltage level.

Each of the memory cells 1 includes MOS transistors Q6 and Q7 where constitute a crossing latch circuit, MOS transistors Q8 and Q9 connected to gate lines and word lines, and resistors R1 and R2 with a high resistance, which are connected to each of gate terminals of MOS transistors Q6 and Q7.

Between the MOS transistors Q1, Q2, and a bit lines driving power supply terminal Vcc, three fuses F1, F2 and F3 are connected in parallel at each column. These fuses F1–F3 are formed on a semiconductor substrate out of polysilicon.

Next, the operation of the semiconductor memory device showing in FIG. 1 and FIG. 2 will be explained hereafter. In case of writing data in the memory cell 1, writing data are applied to the bit lines B0–Bn and /B0–/Bn. A pair of the bit lines are provided at each bit. In case of writing the data, the logic of the pair of bit lines is set contrary to each other. At this state, when the corresponding word line becomes high level, MOS transistors Q8 and Q9 in the memory cell 1 is turned on, and then the voltage of the bit lines is supplied to the gate terminals of the MOS transistors Q6 and Q7, and then the MOS transistors Q6 and Q7 latch the voltage in accordance with the logic "1" or "0".

On the other hand, in case of reading out data from the memory cell 1, the corresponding word line becomes high level. After that, the bit lines B0–Bn and /B0–/Bn are pre-charged at high level by the transistors Q1 and Q2, and these bit lines are maintained to the same voltage to each other by the transistor Q3. After that, the transistors is turned off by means of the signal φeq; consequently, the pre-charging operation and the short-circuiting operation for the bit lines B0–Bn and /B0–/Bn are stopped.

At this time, because the voltage in accordance with the logic "1" or "0" is being latched to the gate terminals of the MOS transistors Q6 and Q7 in the memory cell 1, either of a pair of the bit lines are discharged by the MOS transistors Q6 and Q7 in the memory cell 1 and become low level, and the other is maintained at high level.

The voltages of the bit lines B0–Bn and /B0–/Bn are set based on the voltage Vcc of the bit lines driving power supply terminal and the voltage Vss of the ground line.

When a single fuse is connected between the bit lines driving power supply terminal Vcc and the MOS transistors Q1 and Q2 for pre-charge, due to the voltage drop at both ends of the fuses F1–F3, the voltages of the bit lines B0–Bn and /B0–/Bn decline.

However, because the present embodiment has a plurality of fuses F1–F3 connected in parallel, it is possible to minify the resistance compared with the circuit only one fuse is connected. Accordingly, the voltage drop at both ends of the fuses becomes small to the extent being able to ignore.

Next, the operation of the case the defect that the bit lines short-circuit with the ground lines Vss has occurred will be explained hereafter. In this case, the leak current flows from the bit lines driving power supply terminal Vcc to the ground line Vss via the MOS transistor for pre-charge and the bit lines. In case the leak current has detected with a memory tester or the like, all of the corresponding fuses are cut at each bit. Therefore, the route of the bit lines that the leak current has flown is cut electrically, and the leak current is stopped surely.

Thus, the present embodiment relating to the semiconductor memory device connects a plurality of fuses F1–F3 between the bit lines driving power supply terminal Vcc and the MOS transistors Q1, Q2 for pre-charge, at each bit constituting the SRAM. In case the leak current has flown through the bit lines B0–Bn and /B0–/Bn, because the present embodiment cuts the fuses F1–F3, it is possible to surely suppress the occurrence of the leak current. Further, because the present embodiment connects a plurality of fuses F1–F3 in parallel, it is possible to lessen the voltage drop at both ends of the fuses; consequently, the voltage supplied to the bit lines is not prone to decline.

Though being omitted in FIG. 1 and FIG. 2, a redundancy circuit which relieves the function defect being unable to correctly perform the reading-out and the writing-in may be provided inside the SRAM. In case of replacing the memory cell the function defect has occurred by the other memory cell, the fuses F1–F3 of the bit lines corresponding to the memory cell the function defect has occurred may be cut forcedly. Consequently, it is possible to relieve the leak defect, while relieving the function defect.

In FIG. 1, though an example that three fuses F1–F3 are provided at each bit has been shown, the number of the fuses is not limited to three pieces if more than two pieces.

Figure 3:
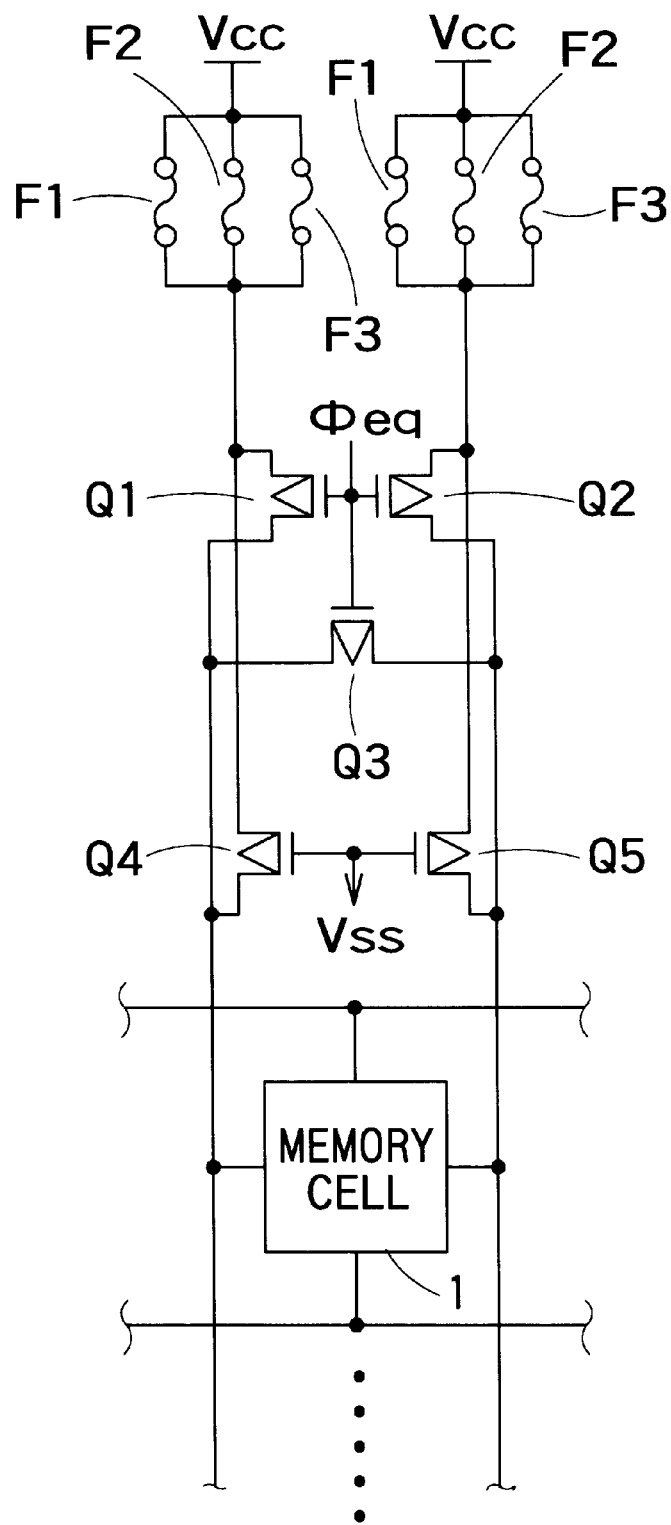
FIG. 3 is a diagram showing an example connecting three fuses to each bit line.

Instead of providing a plurality of fuses at each bit, a plurality of fuses may be provided at each bit. FIG. 3 is a diagram showing an example connecting three fuses F1–F3 between the bit lines driving power supply terminals Vcc and the MOS transistors Q1, Q2 for pre-charge connected to the bit lines B0–Bn and /B0–/Bn, respectively.
(Second Embodiment)

The second embodiment has a feature in which a plurality of fuses are connected in parallel at each section region.

Figure 4A:
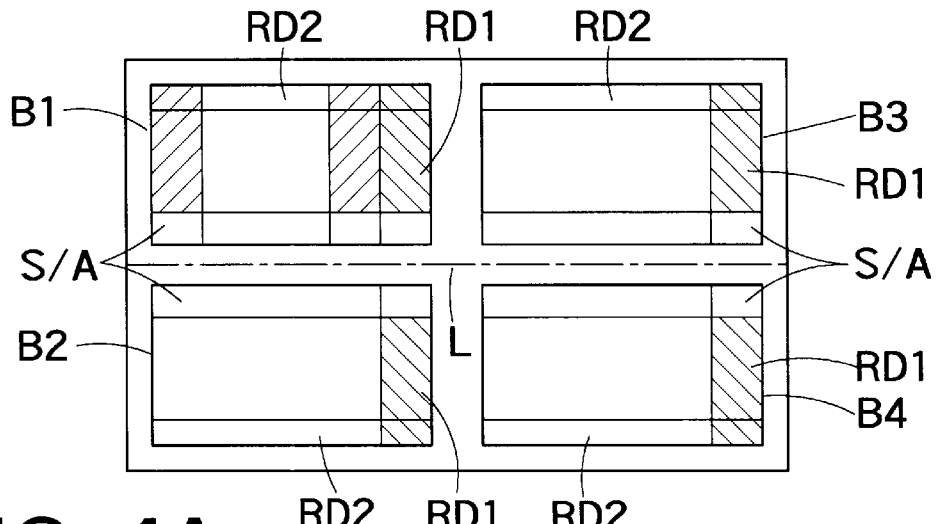
FIG. 4 is a layout diagram of the second embodiment relating to the present semiconductor memory device.
Figure 4B:
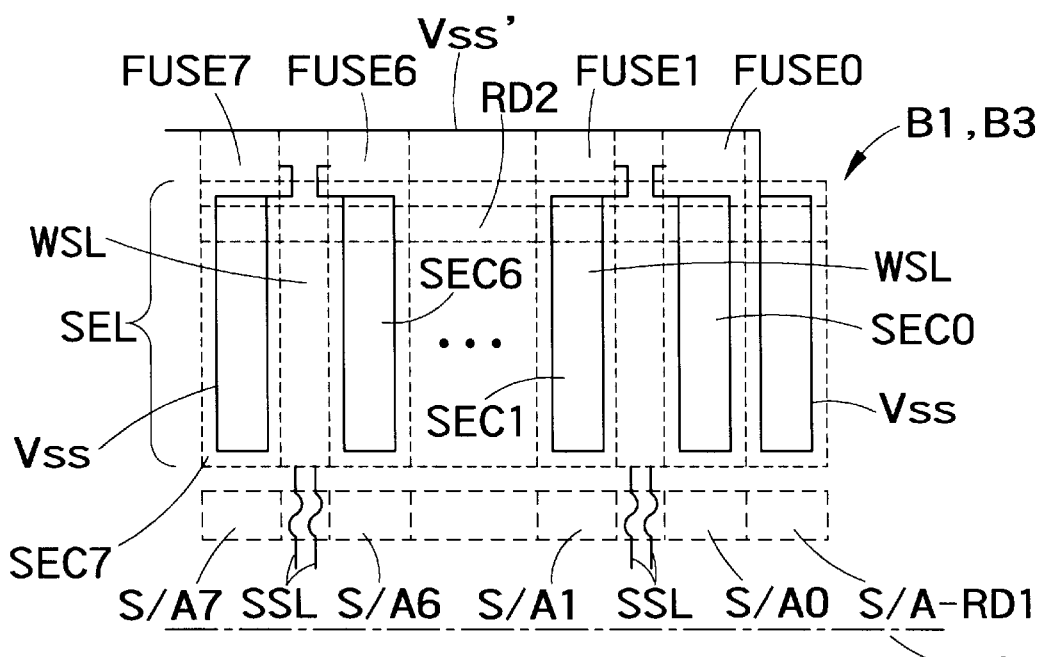
Figure 5:
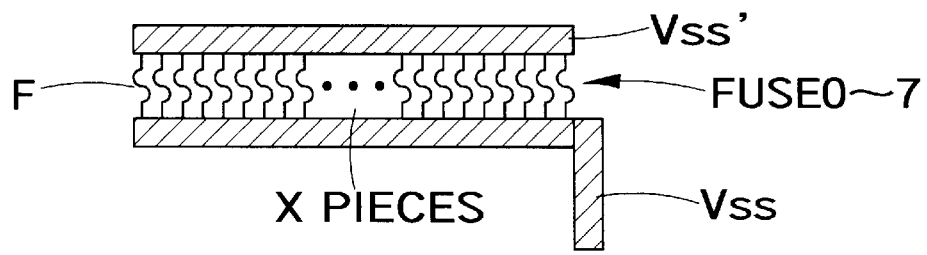
FIG. 5 is a diagram enlarging one block in FIG. 4.

FIG. 4 is a layout diagram of the second embodiment relating to the present semiconductor memory device. FIG. 5 is a diagram enlarging one block in FIG. 4. The semiconductor memory device in FIG. 4 is divided into four blocks B1–B4 as shown in FIG. 4A. As shown in FIG. 4B, each of the blocks B1–B4 includes a plurality of section regions SEC0–SEC7, a redundancy circuit RD1 replacing the defective cells at each section, a redundancy circuit RD2 replacing the defective cells at each row address, and a word lines selecting circuit WSL provided between the section regions.

The section regions SEC0–SEC7 are provided at each address in the column direction. A cell ground power supply lines Vss are formed circularly inside each of the section regions. These cell ground power supply lines Vss are connected to the ground terminal of all the memory cells inside each of the section regions. Outside each of the section regions SEC0–SEC7, a pad ground power supply line Vss' is formed in parallel in the direction that the section regions are arranged. Each of the cell ground power supply line Vss and the pad ground power supply Vss' are connected via the fuses FUSE0–FUSE7 to each other.

Figure 18:
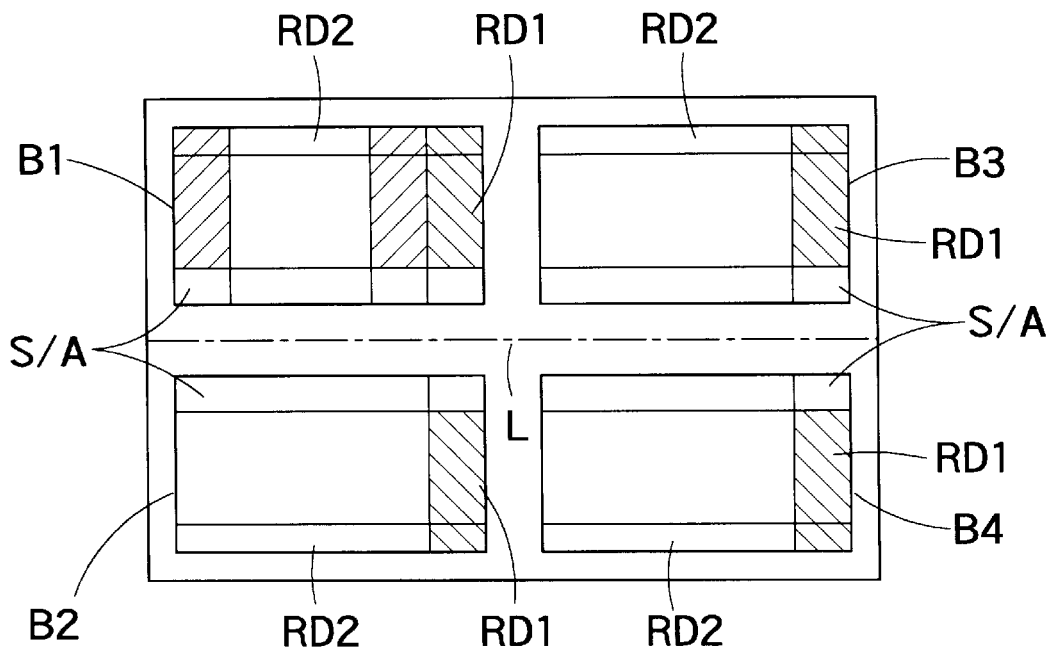
FIG. 18 is a layout diagram of a conventional semiconductor memory device including a redundancy circuit.
Figure 19:
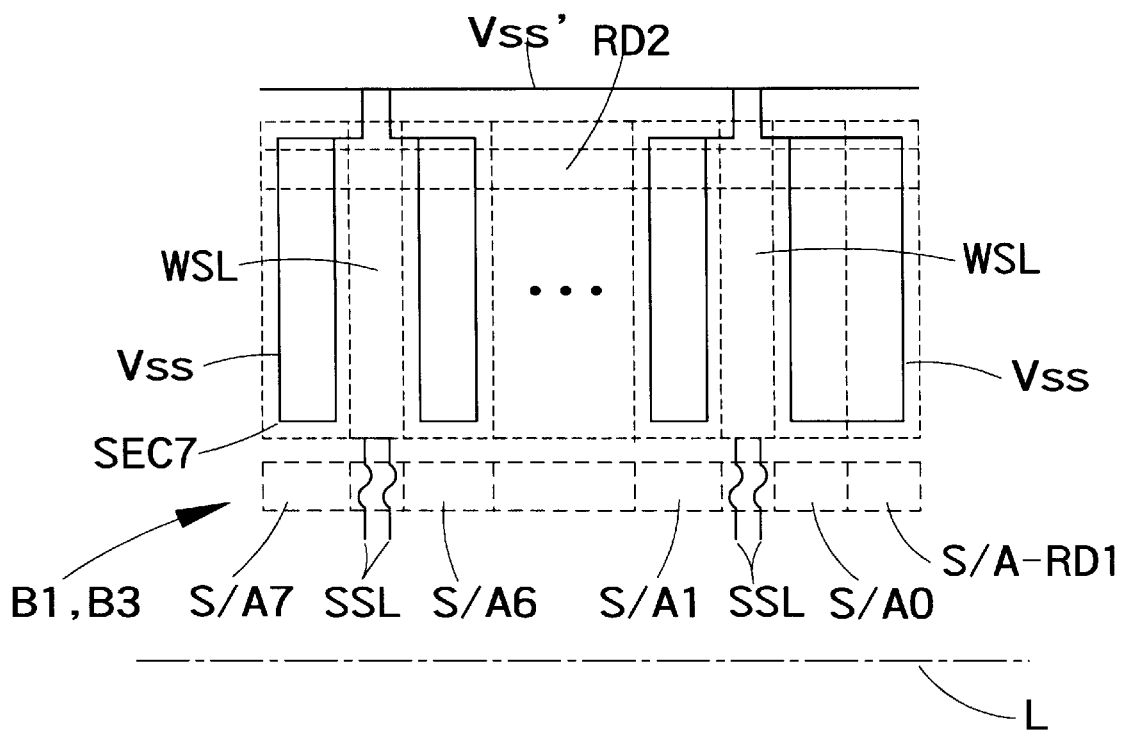
FIG. 19 is an enlarged diagram showing one block in FIG. 18.

To one end of each of the section regions SEC0–SEC7, sense amplifiers S/A0–S/A7 amplifying the signal read out from the memory cells 1 are connected at both sides of an axis showing by a dot-and-dashed line similar to FIG. 18.

As shown in detail in FIG. 5, each of the fuses FUSE0–FUSE7 is formed at a location facing to the sense amplifier by sandwiching the memory cell regions SEL in the section regions SEC0–SEC7. These fuses FUSE0–FUSE7 are composed of a plurality of fuses F connected in parallel between the cell ground power supply line Vss and the pad ground power supply line Vss'.

Next, the operation of the semiconductor memory device showing in FIG. 4 will be explained hereafter. In case all the memory cells in the section region are normal, all the fuses in the section region is contacted electrically; accordingly, the cell ground power supply line Vss and the pad ground power supply line Vss' is also contacted electrically.

On the other hand, in case a defective memory cell is included inside the section regions; for example, if the section region SEC7 showing in FIG. 4B includes the defective memory cell, the address of the section regions SEC7 is set to a after-mentioned decode circuit. Therefore, if this address is inputted from outside, the selection region SEC7 is not selected, but the redundancy circuit RD1 is selected.

At this time, if all the fuses F corresponding to the section region SEC7 are cut, the cell ground power supply line Vss is cut off from the pad ground power supply line Vss'. Accordingly, even if the standby defect has occurred in the section region SEC7, the leak current does not flow through the cell ground power supply line Vss and the pad ground power supply line Vss'.

By the way, because the fuse F showing in FIG. 5 is generally formed out of polysilicon, the resistance becomes large as compared with the metal wires out of Al, Au and so on. For example, the rising value $\Delta V$ of the ground voltage Vss of the memory cells is expressed by equation (1), where a seat resistor of a fuse layer is $r(\Omega \cdot m)$, a fuse area is $S=L(\mu m) \cdot W(\mu m)$, a cell current flowing through the transfer gate in the memory cell is $Ic(\mu A)$, the number of fuses F connected in parallel per a section region is Nx, and the number of columns per one section region is Nc.

$$\Delta V = \{(r \cdot L/W)/Nx\} \cdot Ic \cdot Nc \qquad (1)$$

Figure 6:
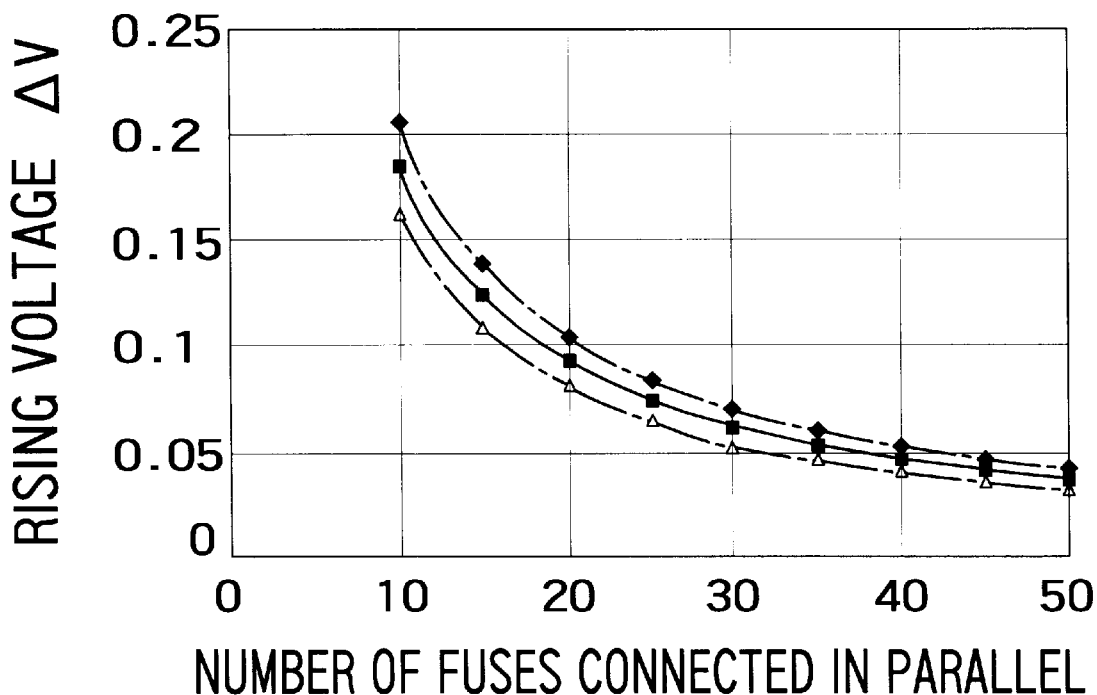
FIG. 6 is a diagram the relationship between number of fuses connected in parallel and rising voltage.

In equation (1), When the seat resistor $r=15$ ($\Omega \cdot m$), the fuse area $S=13.6 \mu m \cdot 1.2 \mu m$, the cell current $Ic=170 \pm 20 \mu A$, and the number of columns $Nc=64$, the relationship between the rising value $\Delta V$ and the number Nx of the fuses connected in parallel is expressed by a curb as shown in FIG. 6.

As seen clearly from FIG. 6, in order to withhold the rising value of the voltage within 0.05 V, it is necessary to set the number Nx of the fuses connected in parallel to more than 50 pieces. In order to withhold the rising value $\Delta V$ of the voltage within 0.1 V, it is necessary to set the number Nx to more than 20. If the rising value $\Delta V$ of the voltage is withheld within 0.1 V, the practical problem does not occur so much. Accordingly, it is desirable to connect more than 20 pieces of the fuses F in parallel.

Figure 7:
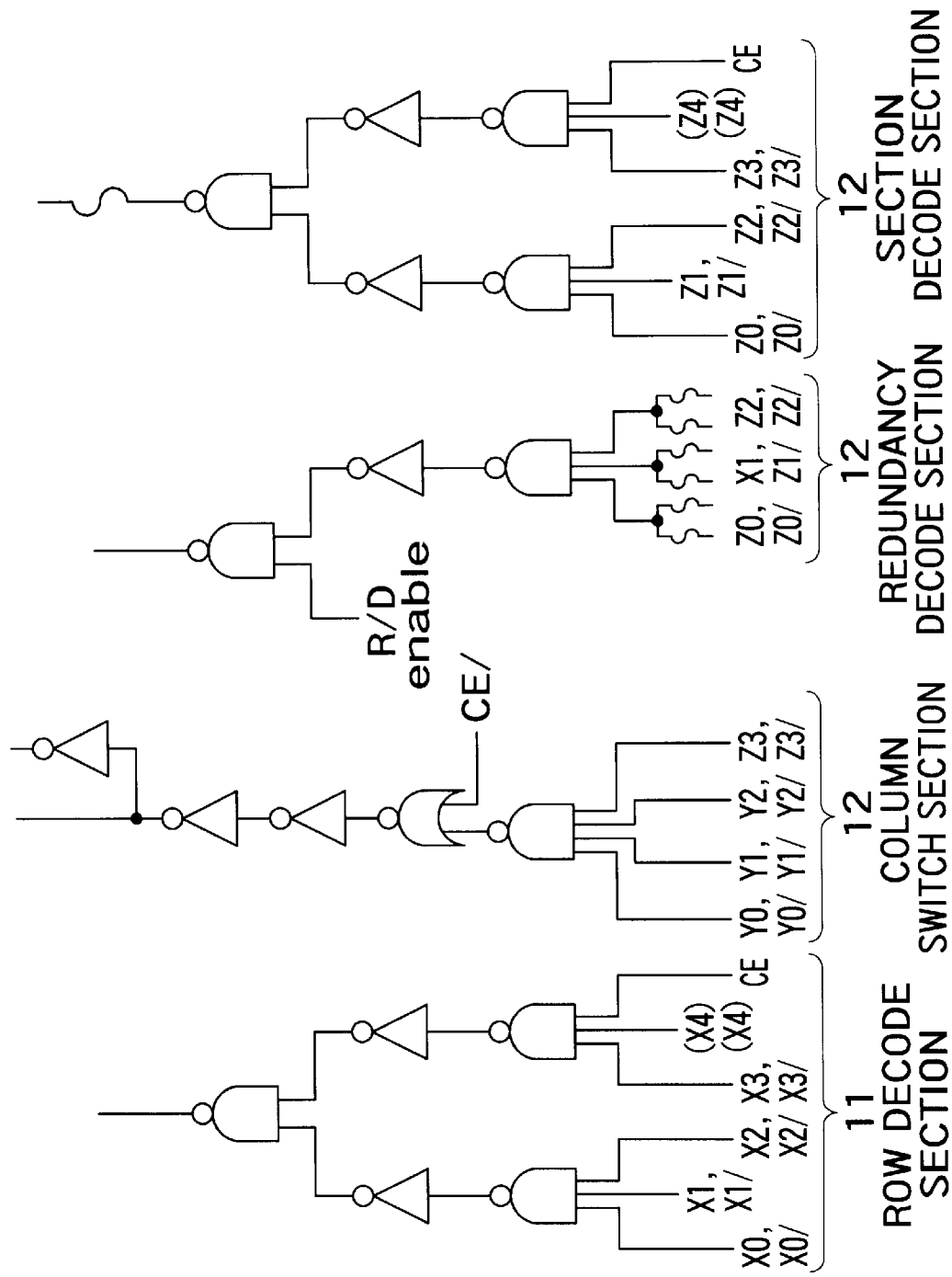
FIG. 7 is a diagram showing an example of a decode circuit in the semiconductor memory device in FIG. 4.

FIG. 7 is a diagram showing an example of a decode circuit in the semiconductor memory device in FIG. 4. The decode circuit in FIG. 7 is a row decode circuit 11 which decodes the row addresses, a column switch section 12 which switches selection/non-selection in the column direction, a redundancy decode section 13 which decodes address to replace by the redundancy circuit RD1, a section decode section 14 which decodes the section region.

In case of replacing with the redundancy circuit RD1, the fuses in the section decode section 14 in FIG. 7 are cut, and a part of the fuses in the redundancy decode section 13 are cut. Therefore, instead of the section region including the defect memory cell, the redundancy circuit RD1 is selected.

Because the decode circuit in FIG. 7 arranges the redundancy decode section 13 adjacently to the decode section 11 and the section decode section 14 performing decode at the ordinary time, and the circuit configuration of the redundancy decode section 13 is similar to that of the row decode section 11 and the section decode section 14, it is possible to set almost fixedly a time necessary for the address signals to arrive to the memory cell, disrelated to whether or not the replacement by the recundancy circuit RD1 is performed.

Figure 8:
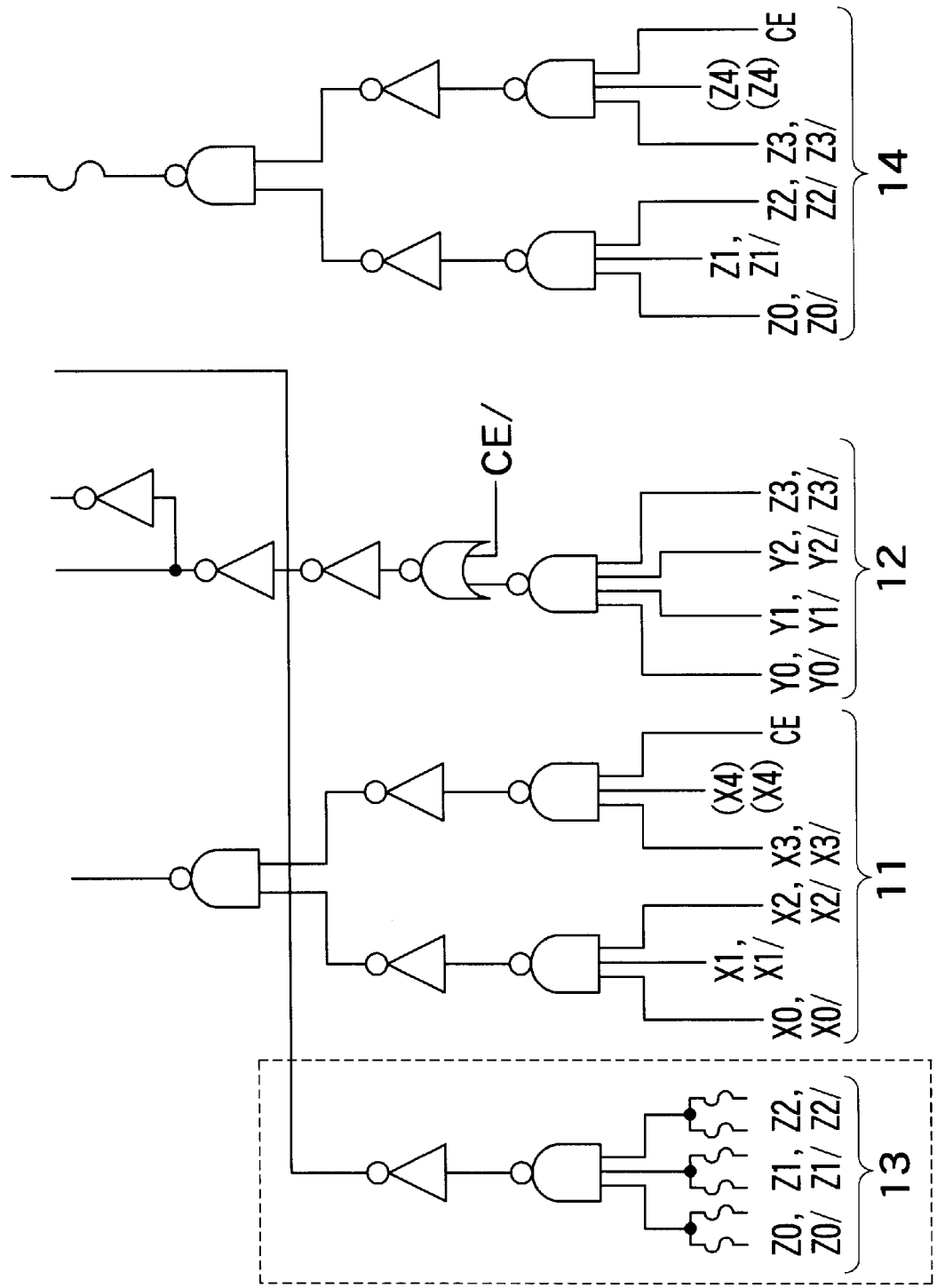
FIG. 8 is a circuit diagram showing an example of the other configuration of the decode circuit.

On the other hand, FIG. 8 is a circuit diagram showing an example of the other configuration of the decode circuit. The decode circuit in FIG. 8 has a feature in which the redundancy decode section 13 is arranged at the location separated from the row decode section 11 and the section decode section 14. In this case, the time necessary for the address signals from outside to arrive to the memory cells is prone to disperse. However, by controlling the length of the wire and so on, it is possible to almost equalize the delay time.

Thus, the second embodiment connects a plurality of fuses F in parallel between the cell ground power supply lines in the section regions and the pad ground power supply lines outside the section regions. When the standby defect occurs in the section regions, the second embodiment replaces the defective memory cells by the redundancy circuit RD1, and cuts all of the corresponding fuses. Therefore, it is possible to surely relieve the standby defect.

(Third Embodiment)

A third embodiment has a feature in which fuses FUSE0–FUSE7 are formed at a place different from the second embodiment.

Figure 9:
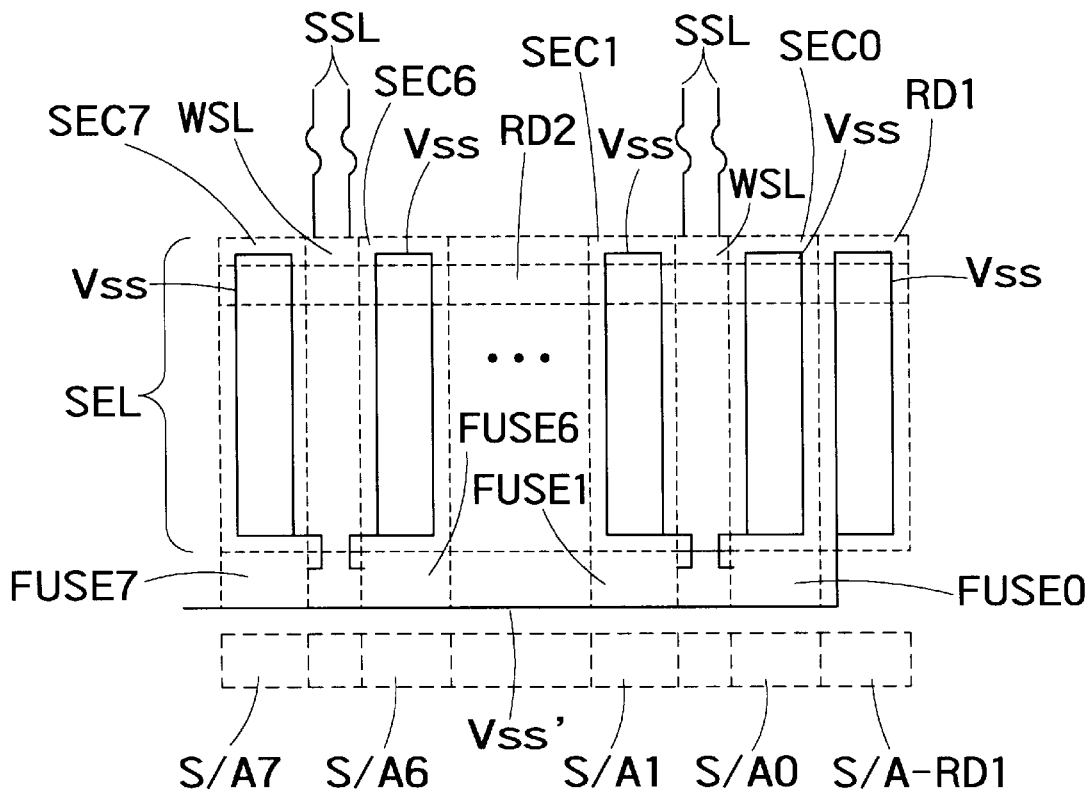
FIG. 9 is a layout diagram of the third embodiment relating to the present invention.
Figure 10:
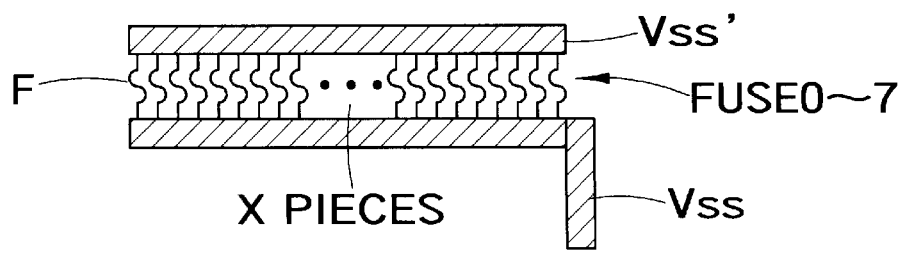
FIG. 10 is a enlarged diagram showing the arrangement of fuses.

FIG. 9 is a layout diagram of the third embodiment relating to the present invention. FIG. 9 shows a diagram enlarging one block of the semiconductor memory device. As shown in FIG. 9, the fuses FUSE0–FUSE7 are formed on the downside of the section regions SEC0–SEC7, that is, between the memory cell region SEL in each of the section regions SEC0–SEC7 and the sense amplifiers S/A0–S/A7. As shown in FIG. 10, each of the fuses FUSE0–FUSE7 are composed of a plurality of fuses F connected in parallel between the cell ground power supply line Vss and the pad ground power supply line Vss'.

In case the standby defect has occurred in the section regions SEC0–SEC7, like the second embodiment, the third embodiment replaces the defective section region by the redundancy circuit RD1, and cuts all of the fuses provided in accordance with the defective section region. Therefore, in the defective section region, the leak current does not flow through the cell ground power supply line Vss.

Further, the decode circuit of the third embodiment may be composed of whichever of the circuit in FIG. 8 and the circuit in FIG. 9.

(Fourth Embodiment)

A fourth embodiment has a feature in which it is possible to connect many fuses in parallel by wrapping over a plurality of fuses.

Figure 11:
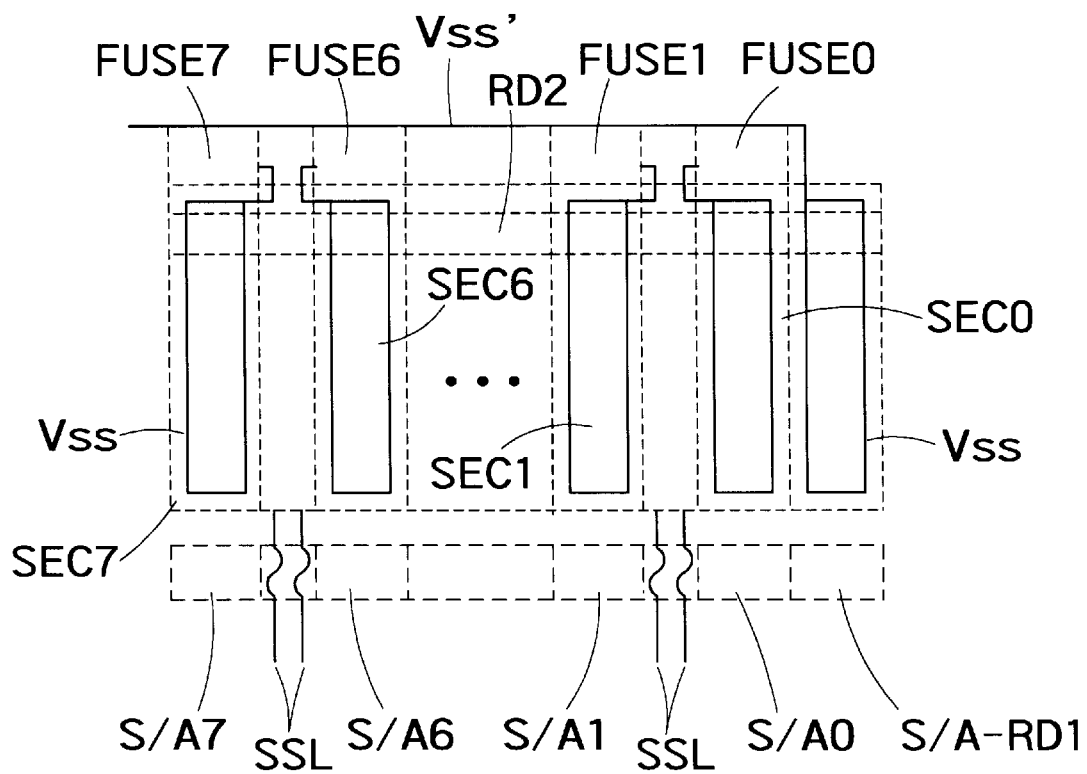
FIG. 11 is a layout diagram of the fourth embodiment.

FIG. 11 is a layout diagram of the fourth embodiment. FIG. 11 shows a diagram enlarging one block being a part of the semiconductor memory device. The fourth embodiment includes the redundancy circuits RD1 and RD2 in the row and column direction, respectively, like the second and third embodiment. The memory cell are replaced at each of the section regions in the column direction.

Figure 12:
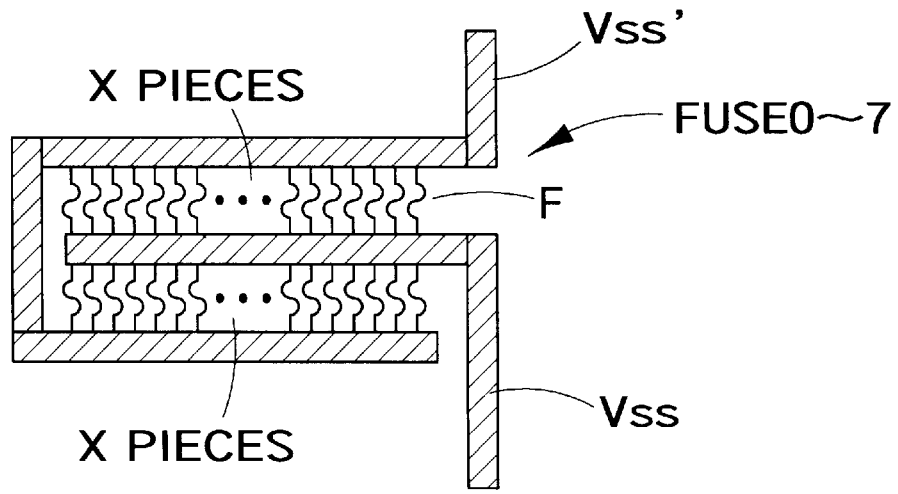
FIG. 12 is a enlarged diagram showing the arrangement of fuses.

In each of the section regions SEC0–SEC7 of the fourth embodiment, like the third embodiment, the cell ground power supply line Vss is formed circularly, and the pad ground power supply line Vss' is arranged at both sides of an apical part of the cell ground power supply line Vss. That is, the pad ground power supply line Vss' is arranged so as to sandwich the apical part of the cell ground power supply line Vss from both sides. As shown in FIG. 12, a plurality of fuses F is arranged in parallel between the cell ground power supply lines Vss and the pad ground power supply line Vss' arranged at both sides of the lines Vss.

By constructing thus, even in case the width in the direction of the word lines is thin, it is possible to connect many fuses in parallel and to minify the voltage difference between both ends of the fuses.

In FIG. 12, though the example which wraps over the fuses at two stages has been shown, if empty region exists in the lengthwise direction, the fuses may be wrapped over at more than three stages.

The decode circuit of the fourth embodiment may be composed of whichever of the circuit in FIG. 7 and the circuit in FIG. 8.

In the above-mentioned second through fourth embodiments, though the examples which include eight pieces of the section regions has been explained, the number of the section regions, the blocks and the redundancy circuits RD1 and RD2 are not limited. Especially, in case of increasing the number of the redundancy circuits RD1 and RD2, because it is possible to replace a plurality of the row address regions and the section regions, it is possible to improve the production yield.

Further, the present invention is capable of applying all kinds of semiconductor memory devices; for example, DRAM and EEPROM besides SRAM.

What is claimed is:

1. A semiconductor memory device including bit lines and word lines, a plurality of memory cells capable of memorizing data in accordance with logic of the bit lines and sending the memorized data to the bit lines, and transistors for pre-charge for being connected to each of the bit lines in series and supplying a charging current to each of the bit lines, comprising:

a bit lines driving power supply terminal for supplying a voltage to each of the bit lines via said transistors for pre-charge;

a plurality of fuses connected in parallel between said bit lines driving power supply terminal and said transistors for pre-charge.

2. The semiconductor memory device according to claim 1, wherein:

said memory cells are static RAM (SRAM) cells;

ground lines are arranged adjacently to the bit lines.

3. A semiconductor memory device for comprising a plurality of bit lines and word lines, a plurality of memory cells capable of memorizing data in accordance with the bit lines and sending the memorized data to the bit lines, and transistors for pre-charge which adjust the voltage level of each of the bit lines, comprising:

a bit lines driving power supply terminal for supplying a voltage to each of the bit lines via said a plurality of transistors for pre-charge;

a single or a plurality of units, each of which is composed of a single or a plurality of said transistors for pre-charge, between said transistors for pre-charge constituting each unit and said bit lines driving power supply terminal, a plurality of fuses being connected in parallel, at each unit.

4. The semiconductor memory device according to claim 3, wherein:

a pair of said bit lines are provided at each bit;

said memory cells, the number of which is almost equal to the number of the word lines, are connected between each of pairs of the bit lines;

said a plurality of fuses are connected in parallel at each of a plurality of pairs of bit lines.

5. The semiconductor memory device according to claim 4, wherein:

said plurality of fuses are connected in parallel at each column address composed of a plurality of bits.

6. The semiconductor memory device according to claim 3, wherein:

said memory cells are static RAM (SRAM) cells;

ground lines are arranged adjacently to the bit lines.

7. A defect relieving method of a semiconductor memory device including a plurality of bit lines and word lines, a plurality of memory cells capable of memorizing data in accordance with logic of the bit lines and sending the memorized data to the bit lines, transistors for pre-charge which adjust the voltage level of each of the bit lines, and a redundancy circuit which replaces the defective memory cell unable to correctly read out or write in, wherein:

a plurality of fuses are connected in parallel between said transistors for pre-charge and a bit lines driving power supply terminal which supplies the voltage to each of the bit lines via said plurality of transistors for pre-charge;

in case of replacing the defective memory cells by said redundancy circuit, all of said fuses in accordance with the bit lines connected to the defective memory cell are cut.

8. A semiconductor memory device including a redundancy circuit capable of replacing a defective memory cell, comprising:

a cell ground power supply line for being formed in each of section regions which are an address units in a column direction and being connected to ground terminals of all memory cells in each of said section regions;

a pad ground power supply line formed outside each of said section regions;

a plurality of fuses connected in parallel between the cell ground power supply line and said pad ground power supply line.

9. The semiconductor memory device according to claim 8, comprising:

sense amplifiers connected to one end of each of said section regions, wherein:

said pad ground power supply line and said plurality of fuses are formed so as to face to said sense amplifier by sandwiching the memory cell region in said section region.

10. The semiconductor memory device according to claim 8, comprising:

sense amplifiers connected to one end of each of said section regions;

said pad ground power supply line and said plurality of fuses are formed between the memory cell region in said section region and said sense amplifier.

11. The semiconductor memory device according to claim 8, wherein:

said pad ground power supply line is formed so as to sandwich an apical part of said cell ground power supply line from both sides;

said plurality of fuses are connected in parallel between the apical part of said cell ground power supply line and said pad ground power supply line formed at both side of said cell ground power supply line.

12. The semiconductor memory device according to claim 8, wherein:

said cell ground power supply line is formed circularly so as to abut an inframarginal part in each of said section regions.

13. The semiconductor memory device according to claim 8, wherein:

the plurality of the fuses are connected in parallel so that the voltage difference between both ends of said plurality of fuses becomes equal to or lower than a prescribed voltage.

14. The semiconductor memory device according to claim 8, wherein:

said memory cells are static RAM (SRAM) cells.

15. A defect relieving method of a semiconductor memory device, wherein:

inside each of section regions which are address units in column direction, a cell ground power supply line connected to ground terminals of all memory cells in said section regions is provided;

outside each of said section regions, a pad ground power line is provided;

a plurality of fuses connected in parallel to each other between said cell ground power supply lines and said pad ground power supply line are provided at each of said section regions;

the replacement by said redundancy circuit is performed at each of said section regions;

in case a defect the leak current flows through said cell ground power supply line in said section region has occurred, the defective section region is replaced by said redundancy circuit, and all of said fuses in accordance with the defective section region are cut.

* * * * *